(12) United States Patent
Liu et al.

(10) Patent No.: US 8,120,037 B2
(45) Date of Patent: Feb. 21, 2012

(54) SYSTEM FOR DISPLAYING IMAGES (75) Inventors: Hanson Liu, Kaohsiung (TW); Ryan Lee, Jhubei (TW)

(73) Assignee: Chimei Innolux Corporation, Chu-Nan (TW)

( * ) Notice: Subject to any disclaimer, the term of this patent is extended or adjusted under 35 U.S.C. 154(b) by 184 days.

(21) Appl. No.: 12/378,860

(22) Filed: Feb. 19, 2009

(65) Prior Publication Data
US 2009/0206344 A1 Aug. 20, 2009

(30) Foreign Application Priority Data
Feb. 20, 2008 (TW) ................ 97105863 A (51) Int. Cl.
*H01L 27/14* (2006.01)
(52) U.S. Cl. ....... 257/72; 257/82; 257/88; 257/E33.005; 257/E29.003; 438/149; 345/82
(58) Field of Classification Search .............. 257/72, 257/88, E33.005, E29.003; 438/149; 345/82
See application file for complete search history.

(56) References Cited

U.S. PATENT DOCUMENTS

| 2002/0057234 A1 * | 5/2002 | Ishizuka et al. ........... 345/77 |
| 2005/0258745 A1 * | 11/2005 | Tsujimura et al. ........ 313/506 |

* cited by examiner

*Primary Examiner* — Jerome Jackson, Jr.
*Assistant Examiner* — Jami M Valentine
(74) *Attorney, Agent, or Firm* — Liu & Liu (57) ABSTRACT

A system for displaying images is disclosed. The system includes a self-emitting display device including an array substrate having a pixel region. A light-emitting diode is disposed on the array substrate of the pixel region. First and second driving thin film transistors are electrically connected to a light-emitting diode. The first driving thin film transistor includes a first gate and an active layer stacked on the array substrate of the pixel region and the second driving thin film transistor includes the active layer and a second gate thereon. The first gate is coupled to a first voltage and the second gate is coupled to a second voltage different from the first voltage during the same frame.

20 Claims, 7 Drawing Sheets

SYSTEM FOR DISPLAYING IMAGES

This Application claims priority of Taiwan Patent Application No. 097105863, filed on Feb. 20, 2008, the entirety of which is incorporated by reference herein.

BACKGROUND OF THE INVENTION

1. Field of the Invention

The invention relates to a light emitting display technology, and in particular to a self-emitting display device for a system for displaying images capable of suppressing threshold voltage shift while preventing reduction of aperture ratio and a method for fabricating the same.

2. Description of the Related Art

Recently, with the development and wide application of electronic products such as mobile phones, PDAs, and notebook computers, there has been increasing demand for flat panel displays (FPDs) which consume less electric power and occupy less space. Organic electroluminescent/light-emitting devices (OELDs/OLEDs) are self-emitting and highly luminous, with a wider viewing angle, a faster response speed, and a simple fabrication process, making them an industry display of choice.

The current trend in FPD technology is for development of an organic electroluminescent display with higher luminescent efficiency and longer operating lifespan. Accordingly, an active matrix (AM) organic electroluminescent device with thin film transistors has been developed.

An AMOLED typically employs polysilicon (poly-Si) or amorphous silicon (α-Si) as an active layer for a thin film transistor (TFT). However, electrons for such an active layer, may be trapped in the gate dielectric layer during device operation, resulting in threshold voltage ($V_{th}$) shift. The luminance of OLEDs depends on injection current ($I_d$). Thus, increased threshold voltage may result in reduced injection current, which negatively impacts the OLED.

BRIEF SUMMARY OF THE INVENTION

A detailed description is given in the following embodiments with reference to the accompanying drawings. A system for displaying images is provided. An embodiment of a system for displaying images comprises a self-emitting display device comprising an array substrate comprising a pixel region. A light-emitting diode is disposed on the array substrate of the pixel region. First and second driving thin film transistors are electrically connected to a light-emitting diode. The first driving thin film transistor comprises a first gate and an active layer stacked on the array substrate of the pixel region and the second driving thin film transistor comprises the active layer and a second gate thereon. The first gate is coupled to a first voltage and the second gate is coupled to a second voltage different from the first voltage during the same frame.

Another embodiment of a system for displaying images comprises a self-emitting display device comprising an array substrate comprising a pixel region. A light-emitting diode is disposed on the array substrate of the pixel region. First and second driving thin film transistors are electrically connected to a light-emitting diode. The first driving thin film transistor comprises a first gate and an active layer stacked on the array substrate of the pixel region and the second driving thin film transistor comprises the active layer and a second gate thereon. A first storage capacitor comprises a first electrode and a second electrode stacked on the array substrate of the pixel region, in which the first electrode is electrically connected to the first gate. A second storage capacitor comprises the second electrode and a third electrode thereon, in which the third electrode is electrically connected to the second gate.

BRIEF DESCRIPTION OF THE DRAWINGS

The invention can be more fully understood by reading the subsequent detailed description and examples with references made to the accompanying drawings, wherein:

FIGS. 3A to 3B and 3B-1 are cross sections of the operation of driving thin film transistors in the self-emitting display device shown in FIG. 1G.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Systems for displaying images and fabrication methods for the same are provided. Referring to FIGS. 1G and 2, in which FIG. 1G illustrates an exemplary embodiment of such a system, and FIG. 2 shows a relationship of the electrical connection (or an equivalent circuit) of a structure shown in FIG. 1G. Specifically, the system incorporates a self-emitting display device 300, such as an organic light-emitting device, comprising a lower substrate (hereinafter referring to as array substrate) 100 and an upper substrate (not shown) opposite thereto. The array substrate 100 and the upper substrate may comprise a transparent material, such as glass, quartz or the like. The array substrate 100 typically comprises a plurality of pixel regions defined by a plurality of scan lines and a plurality of data lines. Here, in order to simplify the diagram, only a pixel region P is depicted.

Moreover, a light-emitting diode D (not shown), first and second driving thin film transistors DT1 and DT2, and first and second storage capacitors C1 and C2 are disposed on the pixel region P of the array substrate 100. The first driving thin film transistor DT1 may be N or P-type. In the embodiment, an example of an N-type thin film transistor (NTFT) is described. The first driving thin film transistor DT1 comprises a gate 104a, an insulating layer (serving as a gate dielectric layer) 106, an active layer 108 having source/drain regions 108a and lightly doped drain (LDD) regions 108c, and a source/drain 120 electrically connected to the source/drain regions 108a. The gate 104a and the active layer 108 are successively disposed on the pixel region P of the array substrate 100. The second driving thin film transistor DT2 may be N or P-type. In the embodiment, an example of an NTFT is described. The second driving thin film transistor DT2 comprises a gate 114a, an insulating layer (serving as a gate dielectric layer) 112, the active layer 108, and the source/drain 120. The gate 114a is disposed on the active layer 108 and substantially aligns the gate 104a. In the embodiment, a common active layer 108 and a common source/drain 120 are common to first and second driving thin film transistors DT1 and DT2.

The first storage capacitor C1 comprises two electrodes 104b and 108b and an insulating layer (serving as a capacitor dielectric) 106 therebetween. The electrodes 104b and 108b are successively disposed on the pixel region P of the array substrate 100. The second capacitor C2 comprises two electrodes 108b and 114b and an insulating layer (serving as a capacitor dielectric) 112 therebetween. The electrode 114b is disposed on the electrode 108b and substantially aligns the electrode 104b. In the embodiment, a electrode 108b is common to the first and second storage capacitor C1 and C2. Moreover, the electrode 108b is extended from the active layer 108. That is, a material layer, such as a polysilicon (poly-Si) or amorphous silicon (α-Si) layer, is defined to form the active layer 108 and the electrode 108b.

Referring to FIG. 2, the input terminals of first and second driving thin film transistors DT1 and DT2 are electrically connected to the electrode (i.e. the electrode 108b) of the first and second storage capacitors C1 and C2 and coupled to a voltage source $V_{dd}$. Moreover, the output terminals of first and second driving thin film transistors DT1 and DT2 are electrically connected to the light-emitting diode D, which is coupled to a voltage source $V_{ss}$ lower than the voltage source $V_{dd}$. The control terminal (i.e. the gate 104a) of the first driving thin film transistor DT1 is electrically connected to another electrode (i.e. the electrode 104b) of the first storage capacitor C1 and the control terminal (i.e. the gate 114a) of the second driving thin film transistor DT2 is electrically connected to another electrode (i.e. the electrode 114b) of the second storage capacitor C2.

In the embodiment, when the self-emitting display device 300 is being operated, the gate 104a of the first driving thin film transistor DT1 is coupled to a voltage V1 and the gate 114a of the second driving thin film transistor DT2 is coupled to a voltage V2 during the same frame, in which the voltages V1 and V2 have the same level and opposing polarities.

Figure 3A:
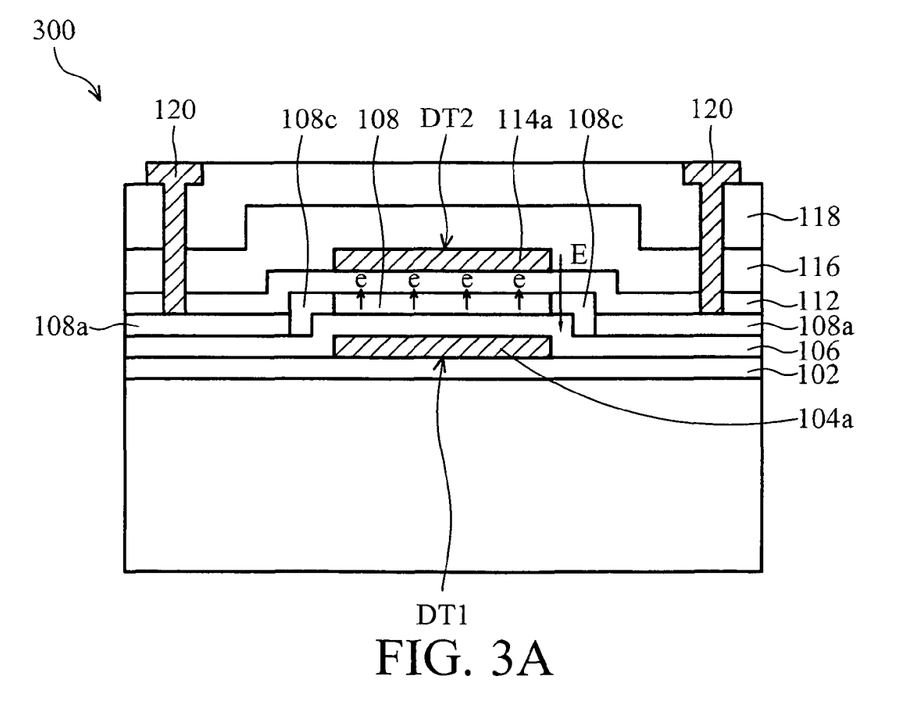
Figure 3B:
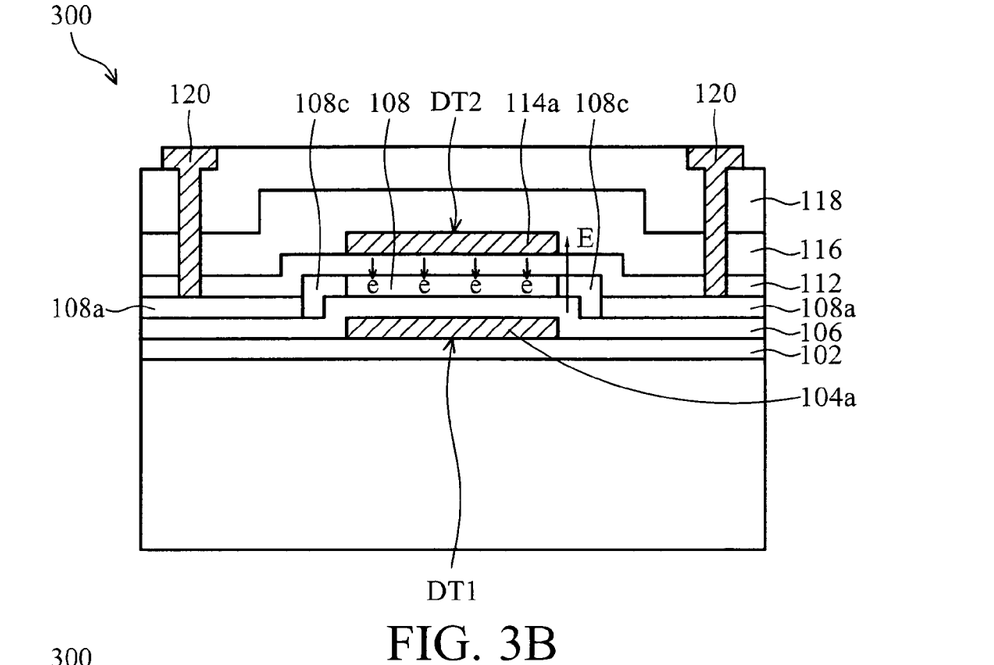

Referring to FIGS. 3A to 3B and 3B-1, which are cross sections of the operation of driving thin film transistors DT1 and DT2 in the self-emitting display device 300 shown in FIG. 1G. As shown in FIG. 3A, the gate 104a of the first driving thin film transistor DT1 is coupled to a voltage V1 having a negative polarity and the gate 114a of the second driving thin film transistor DT2 is coupled to a voltage V2 having a positive polarity during one frame. Accordingly, the direction of the electric field E is downward, as indicated by the arrow, and the light-emitting diode D is driven by the second driving thin film transistor DT2. As a result, the electrons e in the active layer 108 are trapped in the gate dielectric layer 112 of the second driving thin film transistor DT2, such that the threshold voltage of the second driving thin film transistor DT2 may be shifted during the next driving period. Accordingly, as shown in FIG. 3B, during the next frame, the polarity of the voltage V1 is transformed to positive and the polarity of the voltage V2 is transformed to negative, such that the direction of the electric field E is upward, as indicated by the arrow, and the light-emitting diode D is driven by the first driving thin film transistor DT1. As a result, the electrons e trapped in the gate dielectric layer 112 flow back to the active layer 108, preventing the threshold voltage of the second driving thin film transistor DT2 from shifting during the next driving period.

Figure 3B:
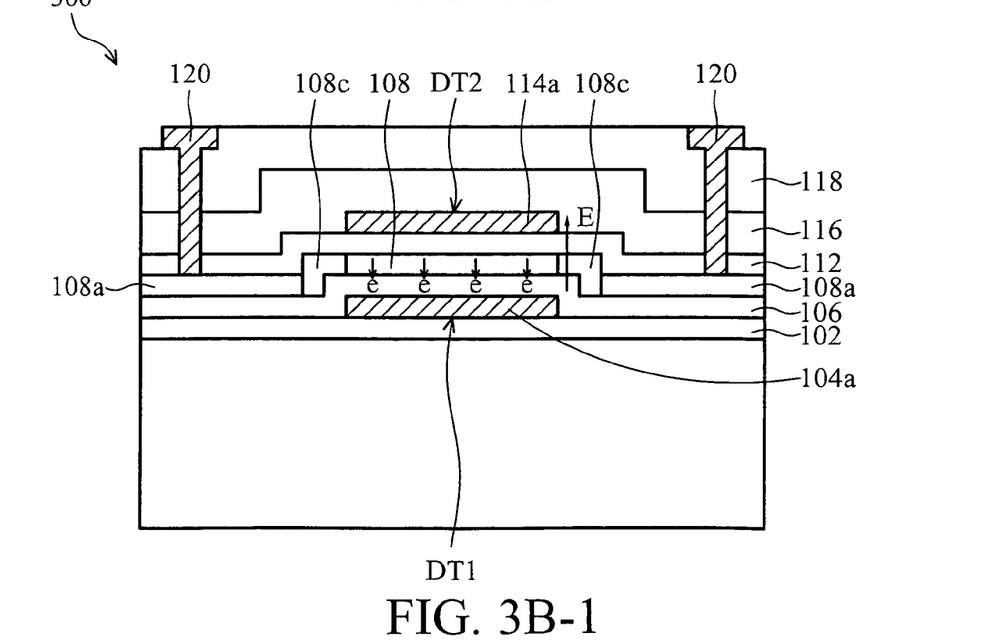

As shown in FIG. 3B-1, the electrons e in the active layer 108 are trapped in the gate dielectric layer 106 of the first driving thin film transistor DT1, such that the threshold voltage of the first driving thin film transistor DT1 may be shifted during the next driving, during the next frame. However, the polarity of the voltage V1 can be transformed to negative and the polarity of the voltage V2 can be transformed to positive during the next frame, such that the direction of the electric field E is downward (i.e. the light-emitting diode D is driven by the second driving thin film transistor DT2). As a result, the electrons e trapped in the gate dielectric layer 106 flow back to the active layer 108, preventing the threshold voltage of the first driving thin film transistor DT1 from shifting during the next driving period. In another embodiment, the voltages V1 and V2 have the same polarity and different levels and can use the similar method to prevent threshold voltage shift.

Figure 1A:
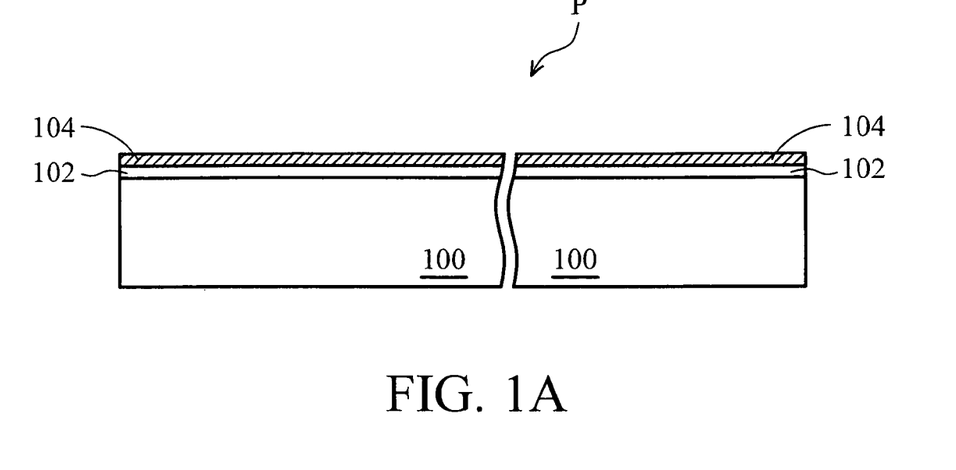
FIGS. 1A to 1G are cross sections of an embodiment of a method for fabricating a system for displaying images incorporating a self-emitting display device.
Figure 1B:
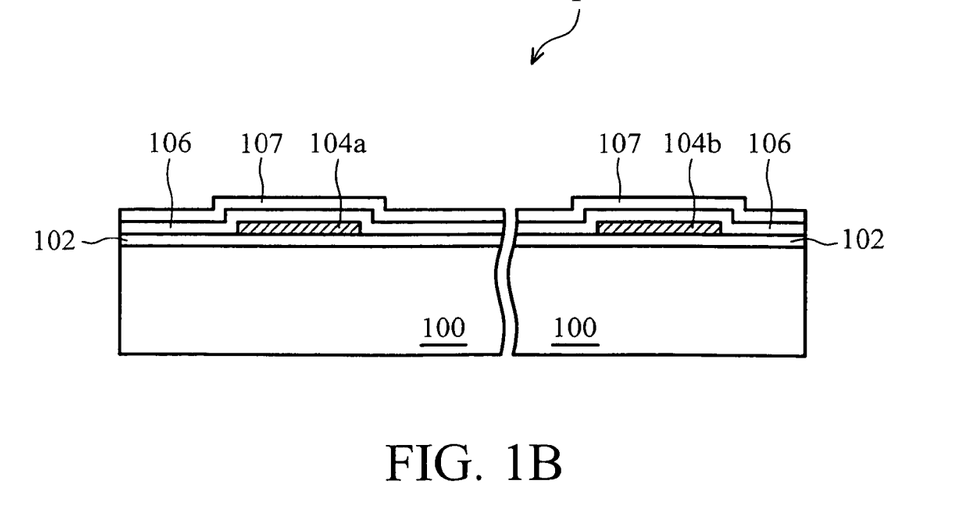
Figure 1C:
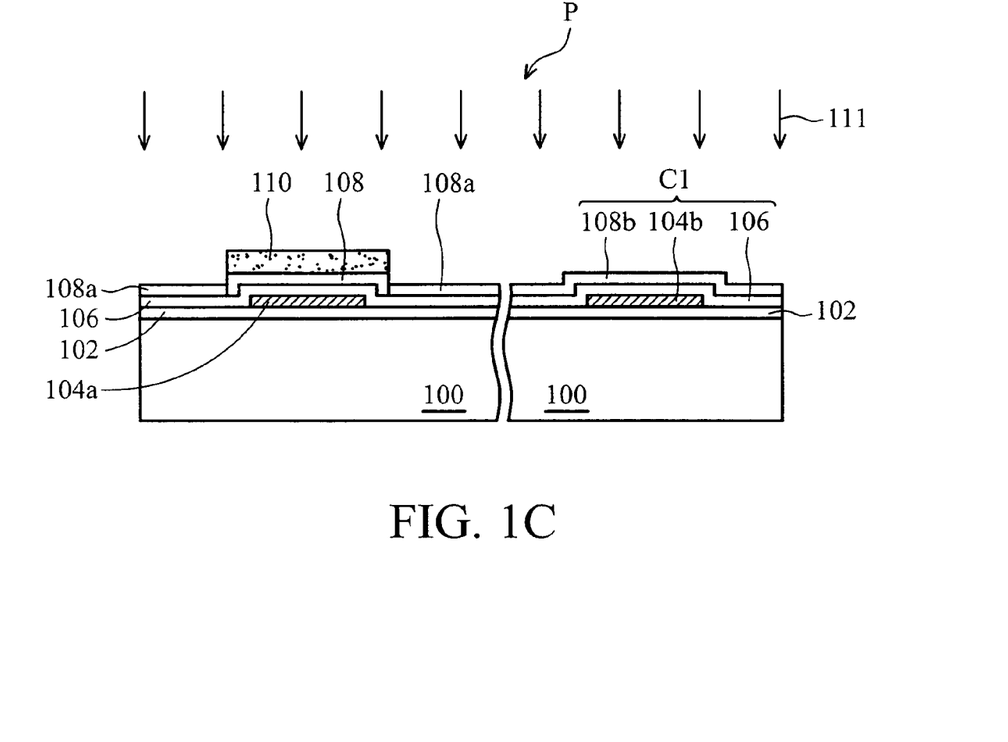
Figure 1D:
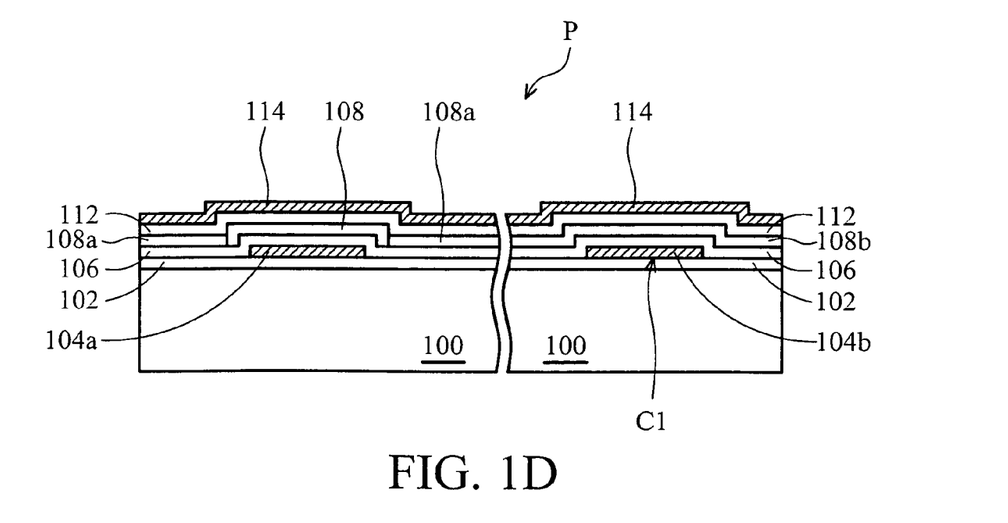
Figure 1E:
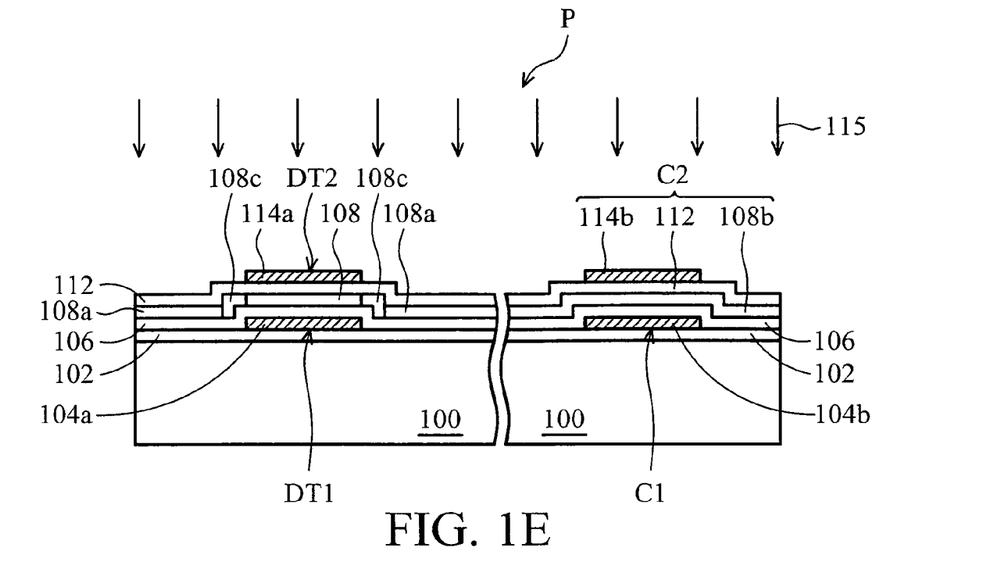
Figure 1F:
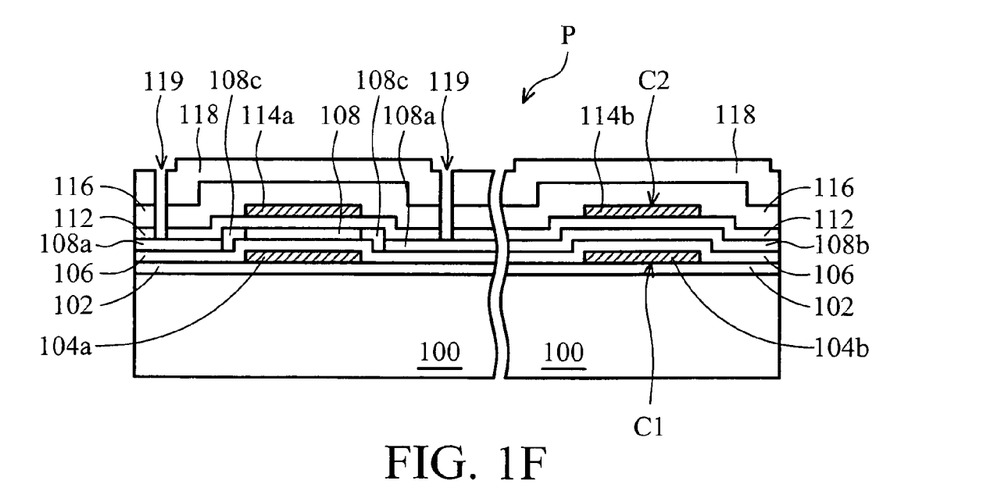
Figure 1G:
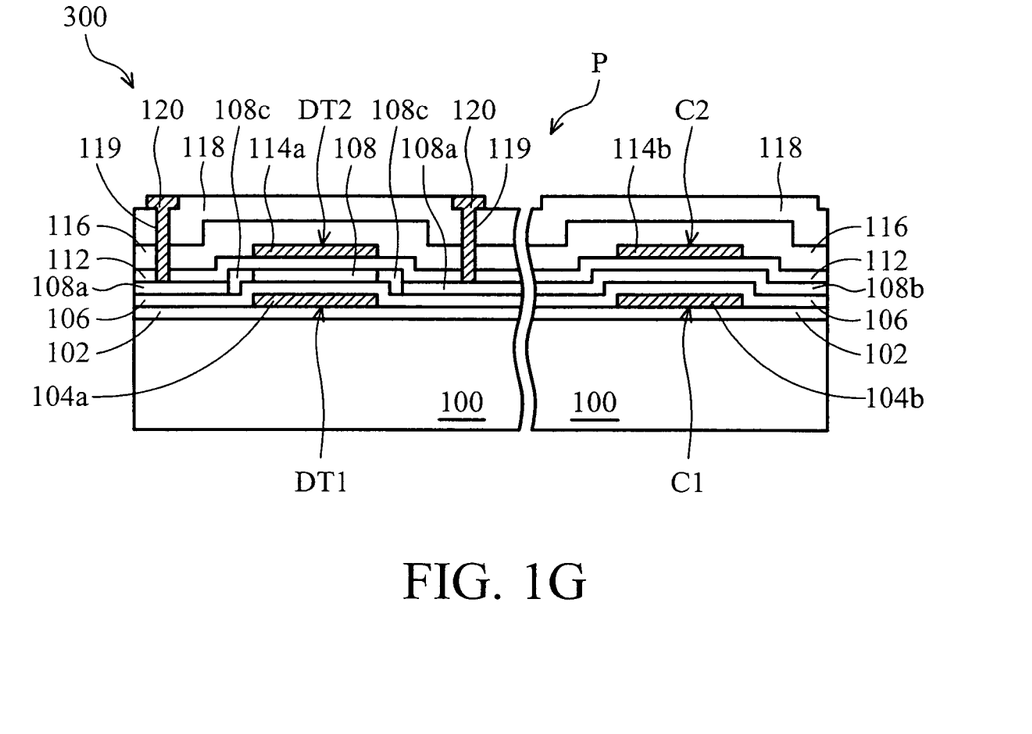
Figure 2:
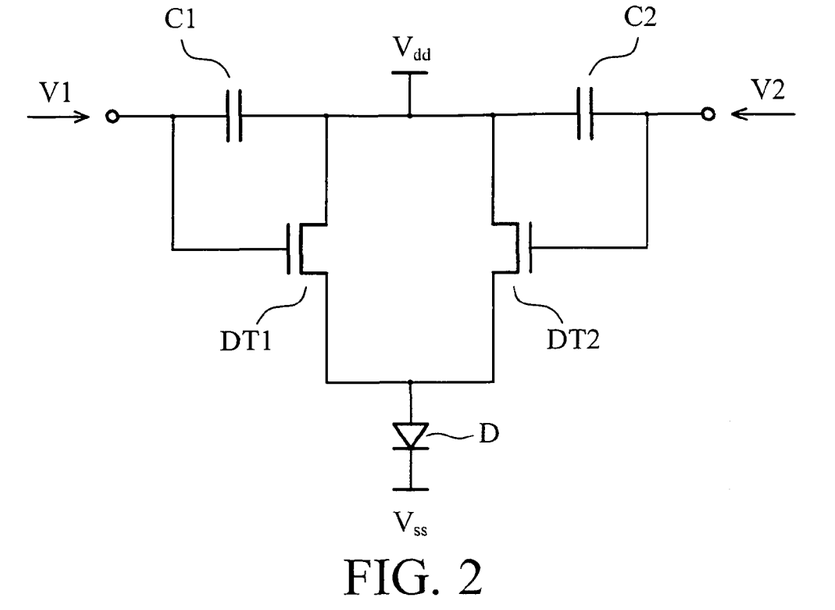
FIG. 2 shows an equivalent circuit shown in FIG. 1G.

Referring to FIGS. 1A to 1G, which illustrate an embodiment of a method for fabricating a system for displaying images incorporating a self-emitting display device. As shown in FIG. 1A, an array substrate 100 comprising a pixel region P is provided. The substrate 100 may comprise glass or quartz. A buffer layer 102 and a conductive layer 104 are successively formed on the array substrate 100. The buffer layer 102 may be a single layer, such as a silicon oxide or nitride layer. The buffer layer 102 may also be multiple layers comprising a silicon oxide and a silicon nitride. The conductive layer 104 may comprise metal, such as Al, Ag, Mo, AlNd, or a combination thereof. The conductive layer 104 can be formed by a conventional deposition process, such as sputtering.

As shown in FIG. 1B, the conductive layer 104 is patterned by a conventional lithography and etching process, to form a gate 104a for a driving thin film transistor and an electrode 104b for a storage capacitor in the pixel region P. Thereafter, an insulating layer 106 and a semiconductor layer 107 are successively formed on the buffer layer 102 and cover the gate 104a and the electrode 104b. The portion of the insulating layer 106 covering the gate 104a serves as a gate dielectric layer and the portion of the insulating layer 106 covering the electrode 104b serves as a capacitor dielectric layer. The insulating layer 106 may be a single layer, such as a silicon oxide or nitride layer. The insulating layer 106 may also be multiple layers comprising a silicon oxide and a silicon nitride. The semiconductor layer 107 may comprise a polysilicon (poly-Si) or amorphous silicon (α-Si) layer.

As shown in FIG. 1B and 1C, a photoresist patterned layer 110 is formed on the semiconductor layer 107 above the gate 104a. Ion implantation 111 is performed on the semiconductor layer 107 using the photoresist patterned layer 110 as an implant mask, to form the active layer 108 with source/drain regions 108a on the insulating layer 106 above the gate 104a and form an electrode 108b on the insulating layer 106 above the electrode 104b, in which a first storage capacitor C1 is composed of the electrodes 104b and 108b and the insulating layer 106.

As shown in FIG. 1D, after removing the photoresist patterned layer 110, an insulating layer 112 and a conductive layer 114 are successively formed on the active layer 108 and the electrode 108b, which is extended from the active layer 108. The insulating layer 112 may be a single layer, such as a silicon oxide or nitride layer. The insulating layer 112 may also be multiple layers comprising a silicon oxide and a silicon nitride. The conductive layer 114 may comprise metal, such as Al, Ag, Mo, AlNd, or a combination thereof. The conductive layer 114 can be formed by a conventional deposition process, such as sputtering. The portion of the insulating layer 112 covering the active layer 108 serves as a gate dielectric and the portion of the insulating layer 112 covering the electrode 108b serves as a capacitor dielectric.

As shown in FIG. 1E, the conductive layer 114 is patterned by a conventional lithography and etching process, to form a gate 114a on the insulating layer 112 above the active layer 108 and an electrode 114b on the insulating layer 112 above the electrode 108b, in which the gate 114a substantially aligns the gate 104a and the electrode 114b substantially aligns the electrode 104b. A second storage capacitor C2 is composed of the electrodes 108b and 114b and the insulating layer 112. Light ion implantation 115 is performed on the active layer 108 using the gate 114a as an implant mask, to form lightly doped drain (LDD) regions 108c therein and adjacent to the source/drain region 108a.

As shown in FIG. 1F, an interlayer dielectric (ILD) layer 116 and a planarization or protective layer 118 are successively formed on the insulating layer 112 and cover the gate 114a and the electrode 114b. Thereafter, the planarization layer 118, the ILD layer 116, and the insulating layer 112 are successively etched to form via holes 119 therein to expose the source/drain regions 108a.

As shown in FIG. 1G, a conductive layer 120 fills the via holes 119 to electrically connect to the source/drain regions 108a. The conductive layer 120 may comprise metal, such as Al, Ag, Mo, AlNd, or a combination thereof, and serve as source/drain for a thin film transistor. In the embodiment, a first driving thin film transistor DT1 is composed of the gate 104a, the insulating layer 106, the active layer 108, and the source/drain 120, and a second driving thin film transistor DT2 is composed of the gate 114a, the insulating layer 112, the active layer 108, and the source/drain 120.

According to the embodiment, the light-emitting diode D is alternately driven by the first and second driving thin film transistors DT1 and DT2. Moreover, the electrons e are back to the active layer 108 by the driving thin film transistor that does not drive the light-emitting diode D. Accordingly, threshold voltage shift can be prevented. Moreover, since the second driving thin film transistor DT2 and the second storage capacitor C2 respectively stack on the first driving thin film transistor DT1 and the first storage capacitor C1, the aperture ratio of the pixel region P is not reduced while increasing the number of the driving thin film transistor and the storage capacitor.

Figure 4:
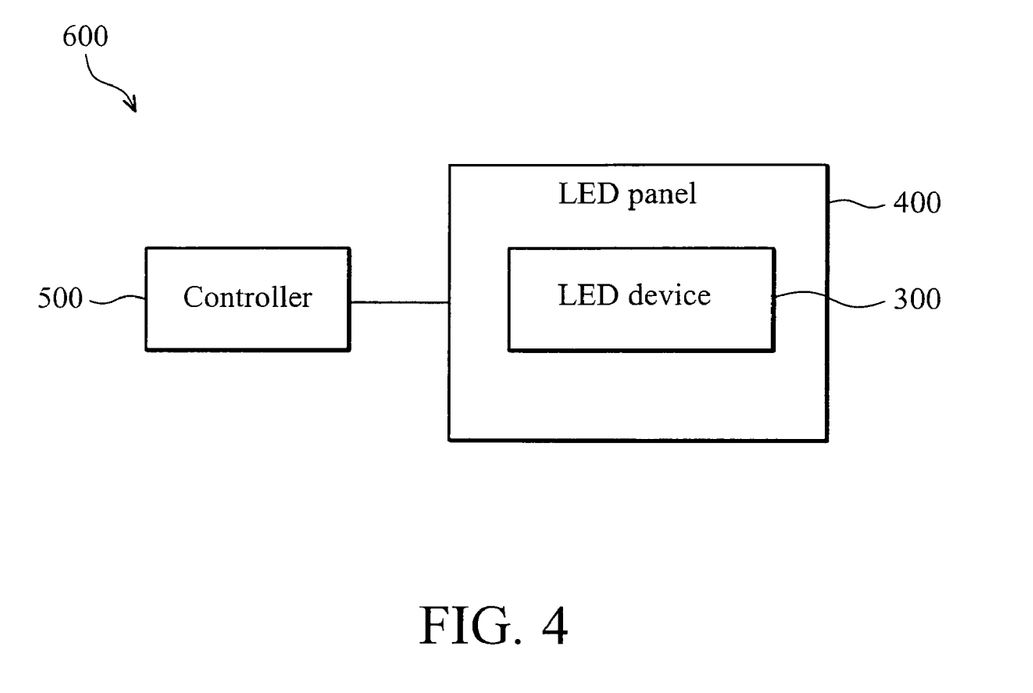
FIG. 4 schematically shows another embodiment of a system for displaying images.

FIG. 4 schematically shows another embodiment of a system for displaying images which, in this case, is implemented as a self-emitting display device or an electronic device such as a laptop computer, a mobile phone, a digital camera, a personal digital assistant (PDA), a desktop computer, a television, a car display or a portable DVD player. In some embodiments, the described self-emitting display device can be incorporated into a display panel, such as a self-emitting display panel. As shown in FIG. 4, a display panel 400 may comprise a self-emitting display device 300 shown in FIG. 1G. In some embodiments, the display panel 400 can be incorporated into an electronic device. As shown in FIG. 4, an electronic device 600 comprises the display panel 400 having the self-emitting display device 300 and a controller 500 that is coupled to the self-emitting display device 300. The controller 500 is operative to provide input signals (e.g. image signals) to the self-emitting display device 300 to generate images.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A self-emitting display device, comprising:
   an array substrate comprising a pixel region;
   a light-emitting diode disposed on the pixel region of the array substrate;
   a first driving thin film transistor electrically connected to the light-emitting diode and comprising a first gate and an active layer stacked on the pixel region of the array substrate;
   a second driving thin film transistor electrically connected to the light-emitting diode and comprising the active layer and a second gate stacked thereon;
   a first storage capacitor comprising a first electrode and a second electrode stacked on the pixel region of the array substrate, wherein the first electrode is electrically connected to the first gate; and
   a second storage capacitor comprising the second electrode and a third electrode thereon, wherein the third electrode is electrically connected to the second gate,
   wherein the active layer is stacked between the first gate and the second gate on the pixel region of the array substrate, and wherein the first gate is coupled to a first voltage and the second gate is coupled to a second voltage different from the first voltage during the same frame.

2. A self-emitting display device, comprising:
   an array substrate comprising a pixel region;
   a light-emitting diode disposed on the pixel region of the array substrate;
   a first driving thin film transistor electrically connected to the light-emitting diode and comprising a first gate and an active layer stacked on the pixel region of the array substrate; and
   a second driving thin film transistor electrically connected to the light-emitting diode and comprising the active layer and a second gate thereon;
   a first storage capacitor comprising a first electrode and a second electrode stacked on the pixel region of the array substrate, wherein the first electrode is electrically connected to the first gate; and
   a second storage capacitor comprising the second electrode and a third electrode thereon, wherein the third electrode is electrically connected to the second gate,
   wherein the first gate is coupled to a first voltage and the second gate is coupled to a second voltage different from the first voltage during the same frame.

3. The device as claimed in claim 2, wherein a material layer is defined to form the active layer and the second electrode.

4. The device as claimed in claim 2, wherein the first and second driving thin film transistors are electrically connected to the second electrode.

5. The device as claimed in claim 2, wherein the third electrode is substantially aligned with the first electrode, and the second gate is substantially aligned with the first gate.

6. The device as claimed in claim 1, wherein the first and second voltages have the same level and opposing polarities.

7. The device as claimed in claim 1, wherein the first and second voltages have the same polarity.

8. A self-emitting display panel, comprising:
   the self-emitting display device as claimed in claim 1; and
   a controller coupled to the self-emitting display device and operative to provide input to the self-emitting display device, such that the self-emitting display device displays images.

9. An electronic device, comprising the self-emitting display panel as claimed in claim 8.

10. The electronic device as claimed in claim 9, wherein the electronic device is a laptop computer, a mobile phone, a digital camera, a personal digital assistant, a desktop computer, a television, a car display or a portable DVD player.

11. A self-emitting display device, comprising:

an array substrate comprising a pixel region;
a light-emitting diode disposed on the pixel region of the array substrate;
a first driving thin film transistor electrically connected to the light-emitting diode and comprising a first gate and an active layer stacked the pixel region of the array substrate;
a second driving thin film transistor electrically connected to the light-emitting diode and comprising the active layer and a second gate thereon;
a first storage capacitor comprising a first electrode and a second electrode stacked on the pixel region of the array substrate, wherein the first electrode is electrically connected to the first gate; and
a second storage capacitor comprising the second electrode and a third electrode thereon, wherein the third electrode is electrically connected to the second gate.

12. The device as claimed in claim 11, wherein a material layer is defined to form the active layer and the second electrode.

13. The device as claimed in claim 11, wherein the first and second driving thin film transistors are electrically connected to the second electrode.

14. The device as claimed in claim 11, wherein the third electrode is substantially aligned with the first electrode.

15. The device as claimed in claim 11, wherein the second gate is substantially aligned with the first gate.

16. The device as claimed in claim 11, wherein the first gate is coupled to a first voltage, the second gate is coupled to a second voltage different from the first voltage during the same frame, and the first and second voltages have the same level and opposing polarities.

17. The device as claimed in claim 11, wherein the first gate is coupled to a first voltage, the second gate is coupled to a second voltage different from the first voltage during the same frame, and the first and second voltages have the same polarity and different levels.

18. A self-emitting display panel, comprising:
the self-emitting display device as claimed in claim 11; and
a controller coupled to the self-emitting display device and operative to provide input to the self-emitting display device, such that the self-emitting display device displays images.

19. An electronic device, comprising the self-emitting display panel as claimed in claim 18.

20. The electronic device as claimed in claim 19, wherein the electronic device is a laptop computer, a mobile phone, a digital camera, a personal digital assistant, a desktop computer, a television, a car display or a portable DVD player.

* * * * *